(12) United States Patent
Lee

(10) Patent No.: US 7,566,587 B2
(45) Date of Patent: *Jul. 28, 2009

(54) METHOD AND APPARATUS FOR PACKAGING ELECTRONIC COMPONENTS

(75) Inventor: David Lee, Palo Alto, CA (US)

(73) Assignee: Azimuth Industrial Co., Inc., Union City, CA (US)

( * ) Notice: Subject to any disclaimer, the term of this patent is extended or adjusted under 35 U.S.C. 154(b) by 884 days.

This patent is subject to a terminal disclaimer.

(21) Appl. No.: 10/730,758

(22) Filed: Dec. 8, 2003

(65) Prior Publication Data

US 2004/0171194 A1    Sep. 2, 2004

Related U.S. Application Data

(63) Continuation-in-part of application No. 09/998,454, filed on Dec. 3, 2001, now Pat. No. 6,660,562.

(51) Int. Cl.
*H01L 21/50* (2006.01)

(52) U.S. Cl. .................... 438/110; 257/E21.499

(58) Field of Classification Search ......... 438/110–115; 257/678–681
See application file for complete search history.

(56) References Cited

U.S. PATENT DOCUMENTS

| | | | |
|---|---|---|---|
| 4,778,326 A | | 10/1988 | Althouse et al. |
| 4,897,508 A | * | 1/1990 | Mahulikar et al. ......... 174/52.4 |
| 5,144,709 A | | 9/1992 | Rooney |
| 5,612,513 A | | 3/1997 | Tuttle et al. |
| 5,776,798 A | | 7/1998 | Quan et al. |
| 5,776,799 A | * | 7/1998 | Song et al. .................. 438/118 |
| 5,801,074 A | | 9/1998 | Kim et al. |
| 5,869,353 A | | 2/1999 | Levy et al. |
| 5,923,958 A | | 7/1999 | Chou |
| 6,004,833 A | | 12/1999 | Kovats et al. |
| 6,222,738 B1 | | 4/2001 | Maeno et al. |
| 6,242,284 B1 | | 6/2001 | Kang et al. |
| 6,246,115 B1 | * | 6/2001 | Tang et al. .................. 257/706 |
| 6,268,236 B1 | * | 7/2001 | Miyawaki .................... 438/106 |
| 6,284,569 B1 | | 9/2001 | Sheppard et al. |
| 6,294,408 B1 | | 9/2001 | Edwards et al. |

(Continued)

FOREIGN PATENT DOCUMENTS

JP        59-96749        6/1984

(Continued)

*Primary Examiner*—Nathan W Ha
(74) *Attorney, Agent, or Firm*—Alan Taboada; Moser IP Law Group

(57) ABSTRACT

A method of fabricating a component package for components such as integrated circuits and a component package. A carrier is molded to form a plurality of cavities. A lid is molded to define a vent hole corresponding to each of the cavities. Components, such as integrated circuit dies, are mounted on the carrier in each of the cavities. A curable adhesive is applied to the top of the sidewalls defining the cavities. The top cover is pressed against the top of the sidewalls with a vent hole aligned with each cavity. The adhesive is then cured under heat. The curing process not only cures the adhesive, it vents moisture from the cavities. The vent holes are then sealed using a curable adhesive. The assembly is cut into individual integrated circuit packages.

11 Claims, 4 Drawing Sheets

U.S. PATENT DOCUMENTS

| | | |
|---|---|---|
| 6,384,472 B1 | 5/2002 | Huang |
| 6,428,650 B1 | 8/2002 | Chung |
| 6,474,477 B1 | 11/2002 | Chang |
| 6,482,675 B2 | 11/2002 | Hsu et al. |
| 6,521,482 B1 | 2/2003 | Hyoudo et al. |
| 6,621,161 B2 | 9/2003 | Miyawaki |
| 6,707,168 B1 * | 3/2004 | Hoffman et al. ............ 257/796 |
| 2002/0014687 A1 | 2/2002 | Gotoh et al. |

FOREIGN PATENT DOCUMENTS

| | | |
|---|---|---|
| JP | 63-127556 | 5/1988 |

* cited by examiner

METHOD AND APPARATUS FOR PACKAGING ELECTRONIC COMPONENTS

CROSS-REFERENCE TO RELATED APPLICATIONS

The present application is a continuation-in-part of U.S. patent application Ser. No. 09/998,454 filed Dec. 3, 2001 now U.S. Pat. No. 6,660,562. U.S. patent application entitled "Method and Apparatus for An Air-Cavity Package," Ser. No. 09/997,937 filed on Dec. 3, 2001, filed in the name of David Lee, contains subject matter related to the present invention. Both of these applications are hereby incorporated herein by reference in their entireties.

BACKGROUND OF THE INVENTION

1. Field of the Invention

The invention generally relates to integrated circuit packaging and, more particularly, to a molded integrated circuit package.

2. Background of the Related Art

Microelectronic devices typically include one or more die (i.e., micro integrated circuits formed on a single substrate) having a multitude of die bond pads, a chip body, and an interconnection scheme to connect the pads on the die to a supporting substrate. Generally, the supporting substrate is formed into a package around the die to provide physical protection from contaminates as well as structural support for the die. The combination of these items is generally referred to as a "chip package". According to conventional packaging methodologies, the number of interconnects for common integrated circuit (IC) packages such as a dual-inline package (DIP), single-inline package (SIP), and others, is limited to the perimeter of the package. Generally, a ball grid array (BGA) package style is used to facilitate an increased connection density. The BGA package provides interconnections from the package bottom or top surface, thus increasing the number of potential interconnection points.

Generally, as ICs increase in speed and performance they also increase in device operating frequency. Unfortunately, the increase in device frequency increases the device sensitivity to parasitic capacitance and inductance, particularly when the IC operates in the gigahertz range. The device packaging, die, and internal die interconnections, all provide potential sources that may negatively impact device performance. For example, to decrease the height and cost of packaging, device packages are often molded simultaneously to a plurality of individual IC circuits on one substrate. The packaging material generally envelopes the circuit such that the material contacts the circuitry. Subsequently, the individual circuits are then cut away from the single substrate using, for example, a high-speed saw to form individual ICs. Unfortunately, as device frequencies increase the type of packaging material used to protect the circuits from external damage and contamination decreases the overall IC performance. In particular, the relatively high dielectric constant of a plastic package reduces the high frequency performance of the IC. This is especially problematic for radio frequency (RF) components such as amplifiers, mixers, and the like.

To accommodate the higher IC performance and the performance of RF circuits, IC manufacturers often use individual ceramic covers having a lower dielectric than a plastic package. Unfortunately, to add individual covers is expensive relative to the molded plastic packaging and therefore is often avoided, thereby sacrificing IC performance.

Therefore, what is a needed is a method and apparatus to provide an efficient and a cost effective package for high speed and RF integrated circuits.

SUMMARY OF THE INVENTION

The invention provides a method and apparatus for packaging at least one electronic component in a cavity. The cavity is filled with a low dielectric constant material such as air or nitrogen. The presence of air surrounding the component reduces the effect of parasitic capacitances and inductances caused by the presence of, for example, a material with a higher dielectric constant encasing the component.

In one embodiment, the method comprises molding a plurality of component package walls on a substrate, where each of the plurality of component package walls defines a cavity to receive a component, mounting an electronic component in the cavities and connecting its leads, bonding a lid to the tops of the walls, and separating the component packages to form individually packaged components that are mounted within a low dielectric constant environment. To facilitate removal of gases from the cavity as the bonding material cures, the lid comprises a vent hold that is aligned with each cavity and later sealed.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The invention provides a method of manufacture of integrated device packages containing low dielectric constant environments. As used herein "package" includes any device package having a low dielectric constant material such as air as the dielectric regardless of package material. Furthermore, as used herein "component" refers to any device or component such as an integrated circuit (IC) device having integrated electrical circuits including one or more dies within a device package and/or components such as resistors, capacitors, and inductors. Such ICs may comprise digital, analog or radio frequency circuits, or combinations thereof.

Figure 1:
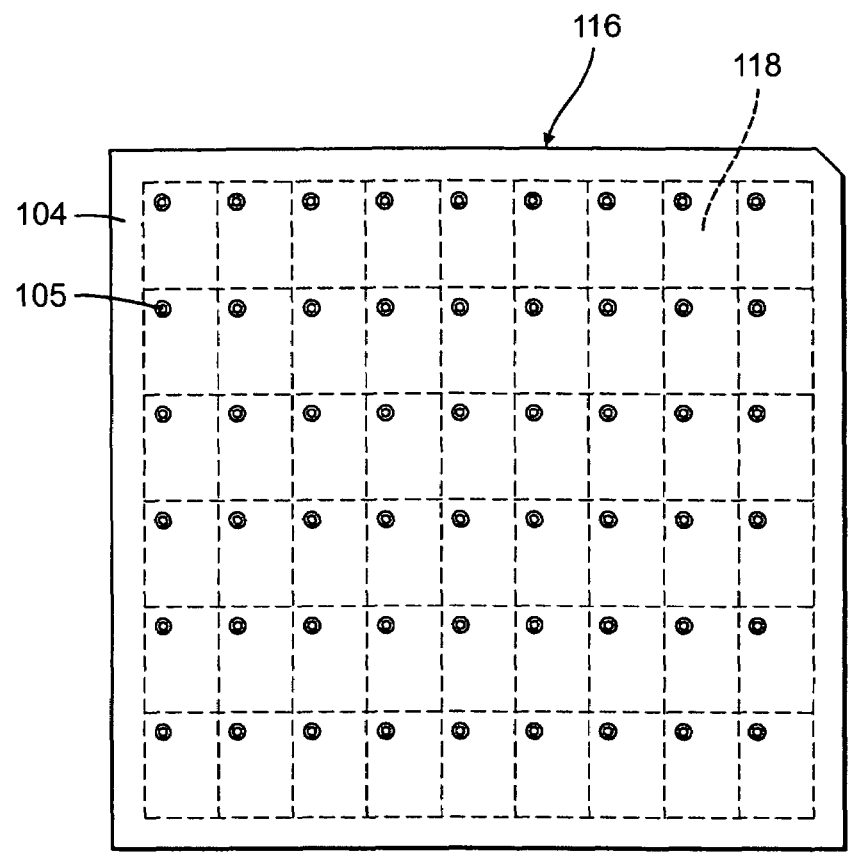
FIG. 1 is a top view of one embodiment of a component package cover.

FIG. 1 is a top view illustration of one embodiment of a component package cover or lid 104. The lid 104 is provided with a plurality of vent holes 105. Each vent hole 105 corresponds to a component package 118 (shown as dashed lines in FIG. 1) in the final component package assembly 116 as discussed with respect to FIG. 3 below.

Figure 2:
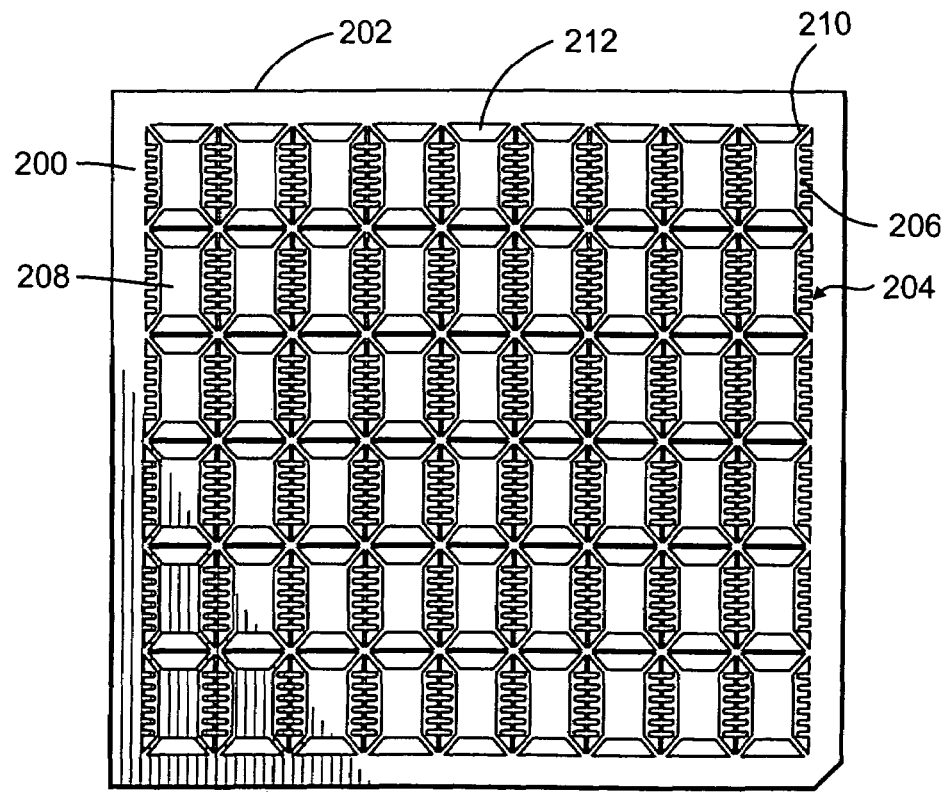
FIG. 2 is a plan view of one embodiment of a carrier.

FIG. 2 is a plan view of a carrier 200 (e.g., a lead frame carrier). The carrier 200 comprises a substrate 202 (a rigid material such as fiberglass or ceramic) that supports a pattern of metallization 204. The metallization 204 comprises bonding pads 206 and a ground plane 208. The ground plane 208 is a rectangular region upon which the electronic component will be affixed. The ground planes 208 are interconnected on the substrate 202 by metal struts 210. The bonding pads 206 will be attached to an IC by wire leads as discussed below. Through-voids 212 extend through the carrier 200 and are positioned outside the individual ground planes 208, struts 210 and bonding pads 206. The through-voids 212 are used to adhere the molded components of the packaging to the carrier 200 as described below.

Figure 7:
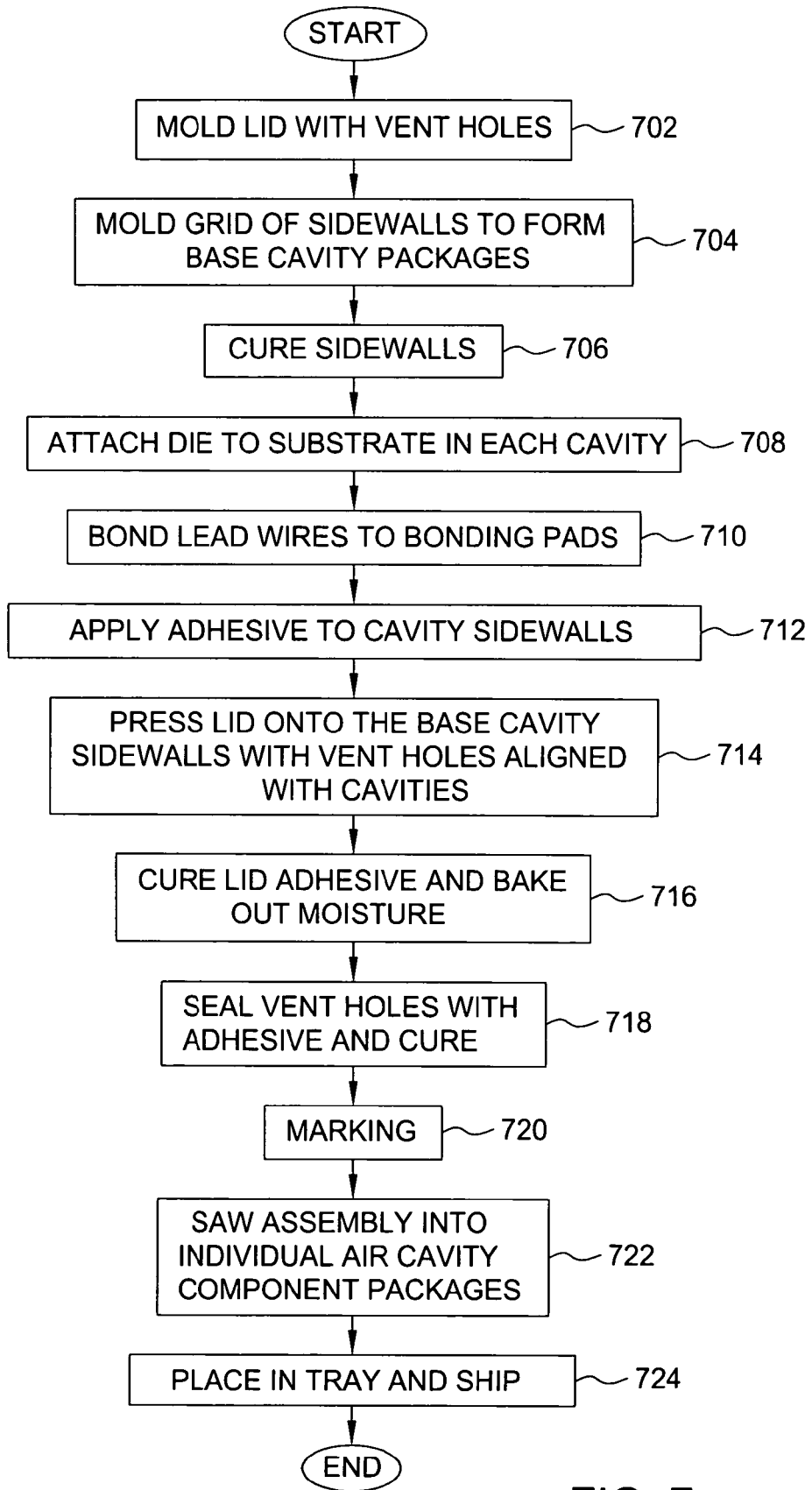
FIG. 7 is a flow diagram of a process of forming component packages.

FIGS. 3-6 depict the package that is formed using the method depicted as a flow diagram of FIG. 7. In step 702, a moldable compound such as thermosetting plastic is applied to a mold to form the lid 104 and its vent holes 105. Other materials may be used to form the lid. Additionally, the vent holes 105 may be formed in the lid 104 by drilling, milling and the like.

In process step 704, the carrier 111 is injection-molded to define a plurality of cavities 300 with a grid of sidewalls 302. In one embodiment, the material used to form sidewalls 300 is the same compound use to form lid 104. This molding process fills the voids 212 in the substrate 202 with the compound to attach the walls 300 to the substrate 202. In step 706, the molded carrier 200 is then cured to form an array 304 of cavities 300. Each cavity 300 is defined by sidewalls 302, ground plane 208, struts 210, bonding pads 206 and substrate 202. The cavities 300 are depicted in this embodiment as being rectangular. Those skilled in the art will realize that they can be of any shape.

The curing process is generally defined by the material that is used to form the sidewalls. Typically the curing process involves exposing the carrier 200 to an elevated temperature for a period of time to harden the sidewall material. Alternatively, the injection molded plastic may be cured as the plastic cools within the mold.

In step 708, individual circuit dies (electronic components) 306 are mounted on and attached to each of the ground planes 208. Each die's leads 308 are bonded to bonding pads 206. Conventional wire bonding compounds are used. Alternatively, the dies 306 may be bonded to the substrate 208 prior to the sidewalls being molded.

In process step 712, a curable adhesive 500 such as epoxy (or any adhesive that bonds plastics) is applied to the top surface 310 of the sidewalls 102. This is performed through a stencil in a screen-printing process. Alternative methods may be used to apply the adhesive to the top 310 of the sidewalls. Alternatively, the adhesive 500 may be applied to the lid 104.

Figure 3:
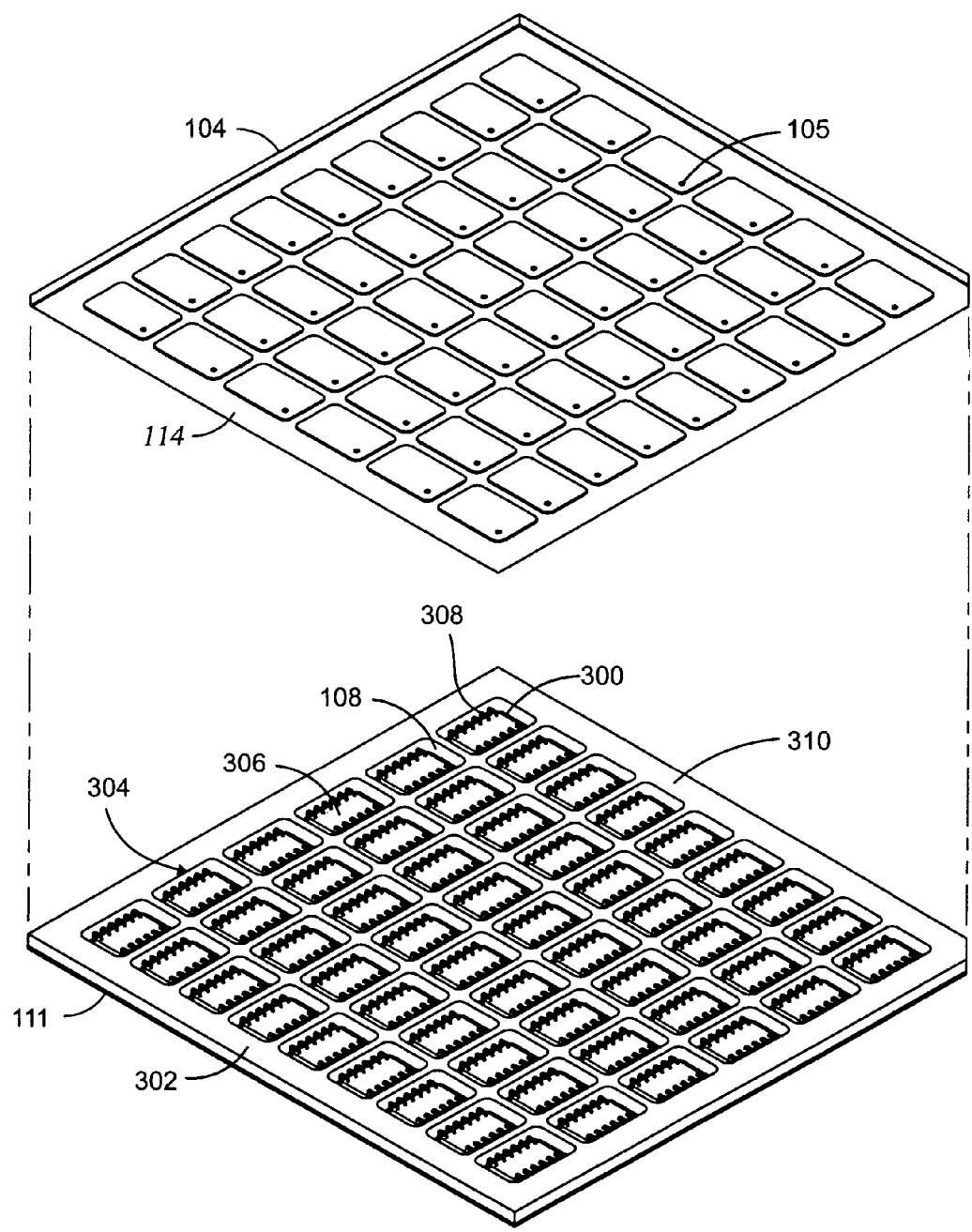
FIG. 3 is a perspective view of one embodiment of a component package cover and a plurality of component package cavities having components therein mounted on a carrier in position for assembly.
Figure 6:
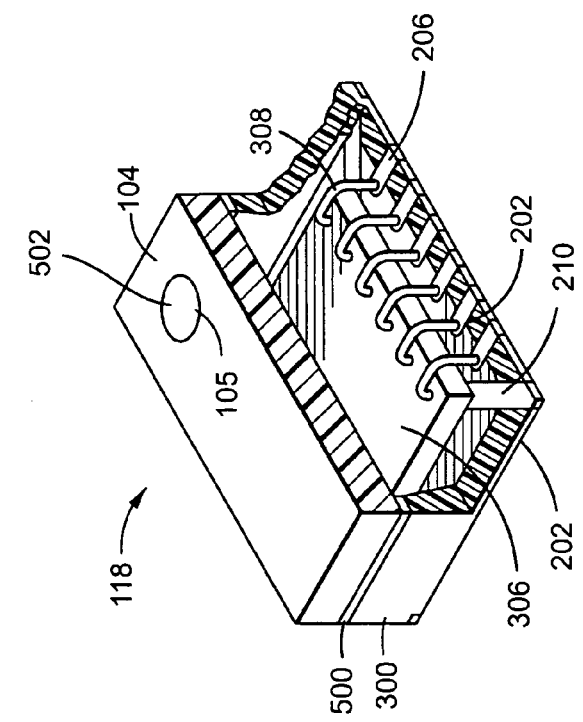
FIG. 6 is a perspective view, partially in cross-section, of one embodiment of an individual component package detached from the plurality of component packages of FIG. 4.

Next, in step 714 and as specifically illustrated in FIG. 3, the lid 104 is aligned with the carrier 200 such that at least one vent hole 105 is associated with each cavity 300. The lid 104 is pressed against the top 310 of the sidewalls 302 with a uniform pressure across the array 304 of cavities 300. In step 716, heat is then applied in order to cure the epoxy and to bake out moisture in the assembly. The time and temperature used for curing the epoxy depends on the type of epoxy used. This process may be performed in a conventional atmosphere at a temperature of about 170° C. During the baking procedure, vent holes 105 allow trapped gasses in each of the cavities 300 to escape. The vent holes 105 also permit moisture from the cavities 300 to escape.

At step 718, an adhesive 502, such as epoxy, is applied to seal the vent holes 105. Generally, the sealant is the same epoxy as used to attach the lid 104 to the carrier 200. The sealant is then cured using an elevated temperature as described above.

At process step 720, the lid 104 is marked with a part number by offset printing or stamping. At step 722, the assembly 116 is divided into a plurality of individual component packages 118. Separation of the packages 118 is typically performed by sawing the assembly 116 along a center line 504 of each sidewall 302. The sidewalls 302, substrate 202, adhesive 500, and lid 104 are adapted to be separated by a cutting tool (not shown) such as a saw, laser, water cutting tool, milling tool, lath, and the like. The cutting tool cuts along the center lines 504 of the sidewalls 302 to separate the component package assembly 116 into the individual component packages 118. In one embodiment, the height of the component package lid 104 relative to the carrier 200 is adjusted to allow the leads 308 sufficient space to be mounted to the integrated circuit die 306 using conventional wiring techniques.

At step 724, individual component packages 118 (shown in FIG. 6) are placed in a tray and shipped to a customer.

Figure 4:
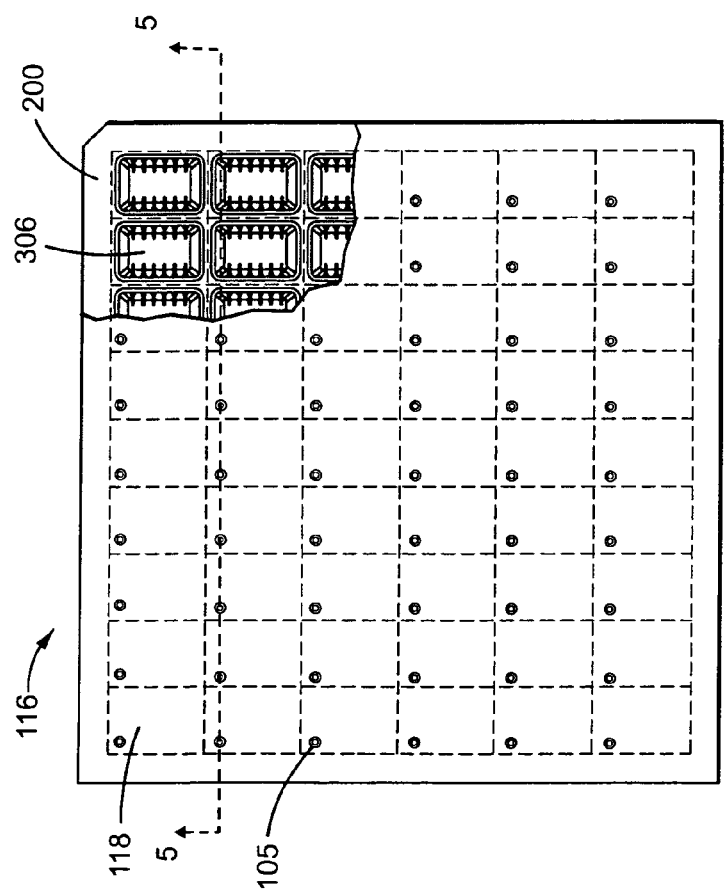
FIG. 4 is a top view partially in cross-section of one embodiment of a component package cover assembled to a plurality of component packages forming a plurality of attached component packages.

When fully assembled into individual component packages 118, as illustrated in FIG. 4, the integrated circuit dies 306 are disposed within the cavities 300 to form a component package assembly 116 defining a plurality of individual component packages 118. Each individual component package 118 includes at least one component such as the integrated circuit die 306 disposed on a substrate 202 of the carrier 200, and interconnected to external connection pads (not shown) on the carrier 200 via bonding pads 206 using interconnection (leads) wiring 308.

Figure 5:
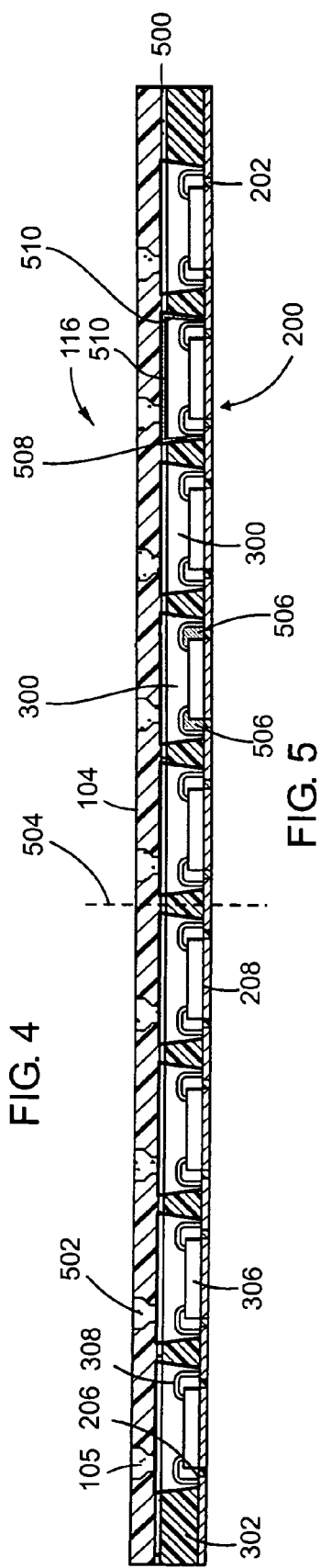
FIG. 5 is a cross sectional view of one embodiment of a component package cover assembled to form the plurality of component packages of FIG. 4.

FIG. 5 illustrates a cross-sectional view of one embodiment of the component package assembly 116 before separating the assembly 116 into a plurality of individual component packages 118. Each cavity 300 includes one integrated circuit die 306 connected to the bonding pads 206. In one embodiment of the invention, to seal the carrier 111, a filling material such as plastic, rubber, or other similar types of filling material 506 is used to fill gaps between the bonding pads 206 and the substrate 202. Such material provides physical rigidity for the leads 308. The remainder of the cavity 300 is filled with a low dielectric constant material such as air.

In another embodiment of the invention, the internal surfaces 508 of the sidewalls 302 and the lid 104 include a metallization layer 510 thereon to provide internal and/or external shielding from electromagnetic radiation. In an alternative embodiment, a metallization layer 510 may be applied to the cover before assembly using coating techniques such as painting, sputtering, and other techniques used to apply metallization coatings.

In an alternative embodiment, the sidewalls 302 may be arranged in a variety of different patterns to accommodate different sizes of components. For example, the pattern of the sidewalls 302 may form a plurality of different package sizes to accommodate a variety of different sized components disposed on the same carrier 200.

While the foregoing is directed to various embodiments of the invention, other and further embodiments of the invention may be devised without departing from the basic scope thereof, and the scope thereof is determined by the claims that follow.

The invention claimed is:

1. A method of packaging at least one component, comprising:
    providing a lid having a plurality of vent holes;
    molding sidewalls onto a substrate to form a plurality of cavities surrounding a component-mounting surface;
    mounting a component on the component-mounting surface in each cavity;
    applying a curable adhesive to a top surface of the sidewalls;
    placing the lid upon the top surface of the sidewalls such that at least one vent hole is aligned with each cavity;
    curing said adhesive, said vent hole providing a path for outgassing during curing;
    sealing said vent holes to form a component package assembly having a plurality of cavities, separated by sidewalls; and
    separating the component package assembly into a plurality of individual component packages.

2. The method of claim 1, wherein the component comprises electronic circuits.

3. The method of claim 1 wherein the component is a radio frequency circuit.

4. The method of claim 1, wherein the top cover and sidewalls are formed of polymers.

5. The method of claim 1, wherein curing said adhesive comprises heating the adhesive.

6. The method of claim 1, wherein separating comprises sawing, laser cutting, water cutting, milling, machining, lathing, and combinations thereof.

7. The method of claim 1 wherein placing the lid upon the sidewalls comprises applying a substantially uniform pressure over each cavity.

8. The method of claim 1 wherein the applying step comprises screen printing the adhesive on the top surface of the sidewalls.

9. The method of claim 1 wherein the cavity comprises a low dielectric constant material.

10. The method of claim 9 wherein the low dielectric constant material is air.

11. The method of claim 9 wherein the component is a radio frequency circuit.

* * * * *